(12) United States Patent
Winter

(10) Patent No.: US 7,673,582 B2
(45) Date of Patent: Mar. 9, 2010

(54) APPARATUS AND METHOD FOR REMOVING AN EDGE BEAD OF A SPIN-COATED LAYER

(75) Inventor: Thomas E. Winter, Pleasant Valley, NY (US)

(73) Assignee: Tokyo Electron Limited, Tokyo (JP)

( * ) Notice: Subject to any disclaimer, the term of this patent is extended or adjusted under 35 U.S.C. 154(b) by 587 days.

(21) Appl. No.: 11/537,619

(22) Filed: Sep. 30, 2006

(65) Prior Publication Data

US 2008/0081110 A1 Apr. 3, 2008

(51) Int. Cl.
*B05C 5/02* (2006.01)
(52) U.S. Cl. .................. 118/663; 118/708; 118/712; 118/52; 118/313; 118/315; 118/316; 118/323; 134/148; 134/151
(58) Field of Classification Search .............. 118/52, 118/56, 319, 320, 313, 315, 316, 323, 663, 118/708, 712; 134/148, 151; 427/8, 240
See application file for complete search history.

(56) References Cited

U.S. PATENT DOCUMENTS

| | | | |
|---|---|---|---|
| 5,608,943 A * | 3/1997 | Konishi et al. .......... | 15/302 |
| 6,063,439 A | 5/2000 | Semba et al. | |
| 6,117,486 A | 9/2000 | Yoshihara | |
| 6,593,045 B2 | 7/2003 | Sato et al. | |
| 6,766,817 B2 | 7/2004 | da Silva | |
| 6,918,404 B2 | 7/2005 | da Silva | |
| 6,986,850 B2 * | 1/2006 | Rolfson ................. | 216/12 |
| 7,066,586 B2 | 6/2006 | da Silva | |
| 7,285,255 B2 | 10/2007 | Kadlec et al. | |
| 2001/0009814 A1 | 7/2001 | Rolfson | |
| 2004/0069215 A1 | 4/2004 | Lin | |
| 2004/0115957 A1 | 6/2004 | Chen | |
| 2004/0188547 A1 | 9/2004 | Kao et al. | |
| 2005/0069821 A1 | 3/2005 | Kulp | |
| 2005/0146716 A1 | 7/2005 | Dixon et al. | |
| 2006/0003591 A1 | 1/2006 | Cheng et al. | |

* cited by examiner

*Primary Examiner*—Laura Edwards
(74) *Attorney, Agent, or Firm*—Wood, Herron & Evans, LLP

(57) ABSTRACT

An edge bead removal device for a spin coater apparatus and methods of edge bead removal that overcome the deficiencies of conventional edge bead removal techniques. The edge bead removal device includes a coater cup and a head situated within the coater cup proximate to a peripheral edge of a substrate. The head is movable in a radial direction relative to an azimuthal axis of a rotatable substrate support inside the coater cup. The position of the head relative to a rim of the peripheral edge is mapped using an optical sensor. When the substrate support rotates the substrate and the head is used to dispense edge bead removal chemical, the radial position of the head is adjusted, as guided by the map, relative to the azimuthal axis to maintain a constant gap between the head and the substrate's peripheral rim.

5 Claims, 4 Drawing Sheets

APPARATUS AND METHOD FOR REMOVING AN EDGE BEAD OF A SPIN-COATED LAYER

FIELD OF THE INVENTION

The present invention relates to apparatus and methods used during the fabrication of semiconductor devices and, in particular, to apparatus and methods for removing an edge bead of a spin-coated layer formed by a spin coating process.

BACKGROUND OF THE INVENTION

Semiconductor device fabrication typically involves a number of processes that may be used to form various features and multiple levels or layers of semiconductor devices on a top surface of a semiconductor wafer or another appropriate substrate. For example, lithography is a process that typically involves transferring a prescribed circuit pattern to a resist layer formed on a top surface of the wafer. During the lithography process, the resist layer is formed on the top surface by dispensing a small amount of a liquid resist solution near the center of the wafer, distributing the resist solution across the top surface by a spin-coating process, exposing the resist to radiation in a prescribed pattern, and subsequently developing the pattern.

Resist spin coating is conducted in an automated track system using wafer handling equipment that transports the wafers between the various lithography operation stations, such as resist spin coating stations, developing stations, baking stations, and chilling stations. Automated wafer tracks enable various processing operations to be carried out simultaneously. One family of automated track systems widely used in the industry is the line of coater/developer tracks commercially available from Tokyo Electron Limited under the Clean Track brand.

During the spin-coating process, the wafer is held on a disk shaped, rotating spin chuck. The diameter of the spin chuck is slightly less than the diameter of the wafer. The spin chuck is positioned so that the wafer is oriented in a level horizontal plane. In operation, the spin chuck supports a backside of the wafer and applies suction to the wafer backside to hold the wafer in place as the chuck rotates. An amount of the liquid resist solution is applied at the center of the top surface of the rotating wafer. The spin chuck then rotates the wafer at a high rotational velocity to spread the liquid resist solution radially outward from the center of the wafer by centrifugal force towards the wafer's peripheral rim to coat the top surface.

Ideally, all excess liquid resist solution is ejected from the peripheral edge of the wafer. In practice, however, some excess liquid resist solution tends to collect along the peripheral edge of the wafer as an artifact of the spin-coating process. The accumulated liquid forms an edge bead as the resist solution solidifies. Portions of the edge bead may subsequently detach from the wafer and become a source of particulate contamination during subsequent process steps. Particulate contamination may unfortunately contribute to the yield loss of the integrated circuits being built on the wafer. Consequently, the peripheral edge of the wafer is typically cleaned in an edge bead removal process during, or after, the spin-coating process. The cleaning process removes the resist from an annular region of the layer near the peripheral edge and the edge bead carried by the annular region.

One conventional approach for removing the annular resist region and edge bead is to direct a stream of an edge bead removal chemical, such as a solvent, onto the wafer edge while the wafer is spinning. The solvent stream may be dispensed through a nozzle aimed toward the backside edge of the wafer, in which case the solvent flows about the peripheral edge to the top surface of the wafer. One shortcoming of this edge bead removal process is that the solvent flow and angular velocity of the spin chuck must be accurately controlled to cause the solvent to flow about the peripheral edge.

Another conventional approach for removing the annular resist region and edge bead is to dispense the solvent stream through a nozzle directly onto the top surface of the wafer. The nozzle is located at a significant height above the top surface. The solvent stream dissolves and removes a portion of the spin-on film including the edge bead. One shortcoming of this edge bead removal process is that, because of the physical separation, the solvent stream must be delivered with a high spatial accuracy. However, the delivery of the solvent stream is difficult to control because of factors such as variations in wafer size, the accuracy of centering the wafer in the spin chuck, and positioning errors in locating the nozzle used to spray the solvent stream. As a result, the radial width of the annular region of the resist removed by the chemical may be difficult to precisely control and is inherently unpredictable.

Conventional chemical edge bead removal processes suffer from several additional shortcomings. For example, conventional chemical edge bead removal processes require a process time of about 15 seconds to about 20 seconds per wafer and an angular velocity of 500 to 2000 revolutions per minute. Moreover, the amount of chemical used in conventional edge bead removal processes add to the volume of waste generated in the integrated circuit fabrication process. The annular width of the removed annular region of resist also reduces the usable area on the top surface of the wafer available for device fabrication. Conventional chemical edge bead removal processes have the ability to remove a 0.5 mm wide annular region with an accuracy of +0.5 mm, which represents a significant reduction in the useable wafer area. The relatively large annular width increases in its detrimental effect as devices are scaled to smaller critical dimensions and more densely packed.

What is needed, therefore, is a device for removing the resist edge bead that overcomes these and other deficiencies of conventional spin coaters and edge bead removal methods.

SUMMARY OF THE INVENTION

In accordance with an embodiment, an apparatus comprises a substrate support in a coater cup and a nozzle adapted to dispense a material in a liquid phase onto a substrate held by the substrate support. The substrate support is configured to rotate the substrate relative to the coater cup about an azimuthal axis, which spin coats the material in a liquid phase across a top surface of the substrate to form a layer of the material. The apparatus further comprises a head radially moveable relative to the azimuthal axis of the substrate support between a first position in which the head is proximate to a peripheral rim of the substrate and a second position in which the head is retracted from the peripheral rim of the substrate. The head includes a plurality of nozzles adapted to dispense a chemical capable of dissolving the material to contact the layer in an annular region of the layer proximate to the substrate's peripheral rim, when the head is in the first position, and thereby expose the annular region to the chemical.

In accordance with another embodiment, a method comprises spin coating a material in a liquid phase across a top surface of a substrate to form a layer. The method further comprises rotating the substrate and the layer on the substrate about an azimuthal axis, placing a head carrying nozzles proximate to a peripheral rim of the substrate, and dispensing a chemical capable of dissolving a material forming the layer from the nozzles into contact with an annular region of the layer. The annular region of the layer, which is proximate to the peripheral rim of the substrate, is removed by the chemical.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Figure 1:
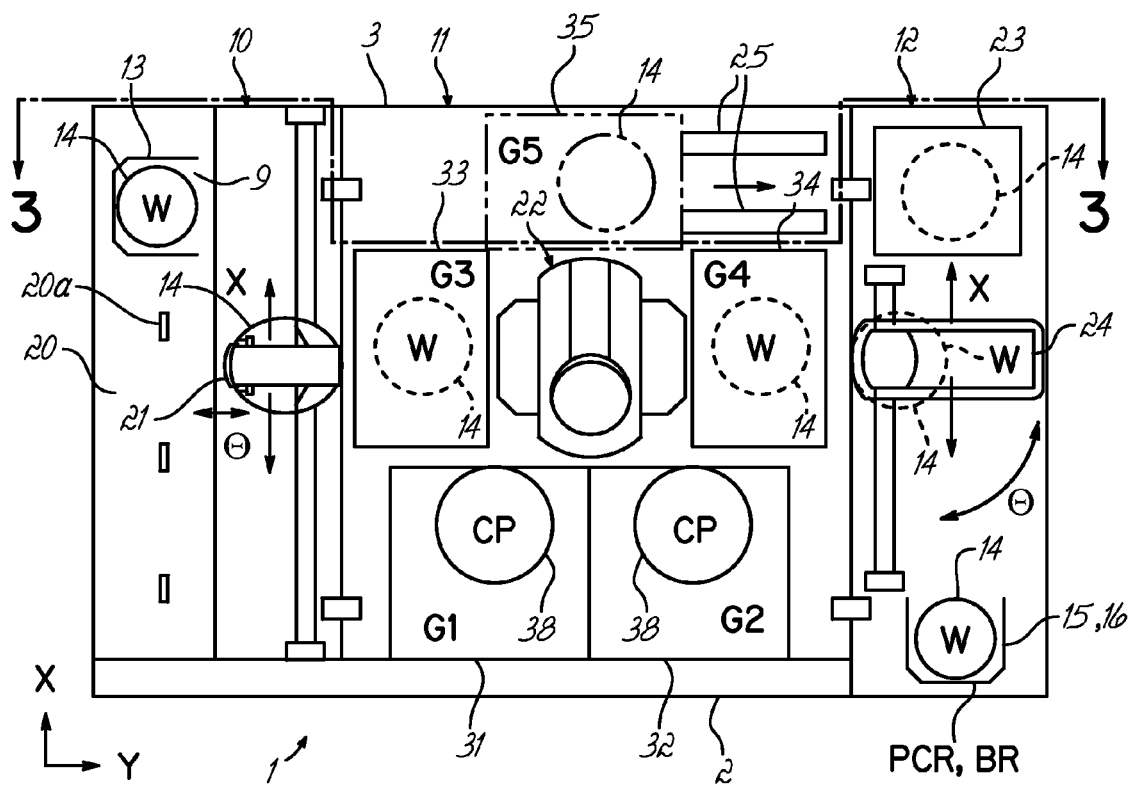
FIG. 1 is a top view of a schematic diagram of the coating/developing process system according to an embodiment of the present invention.
Figure 2:
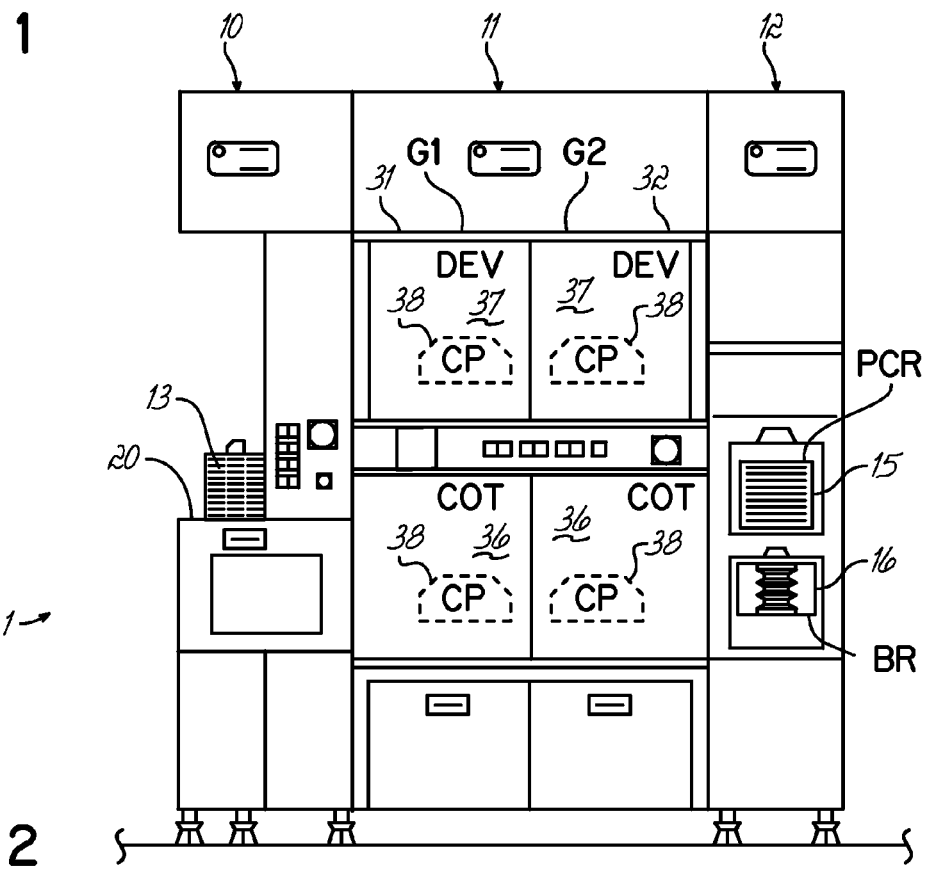
FIG. 2 is a front view of a schematic diagram showing the structure of the coating/developing process system of FIG. 1.
Figure 3:
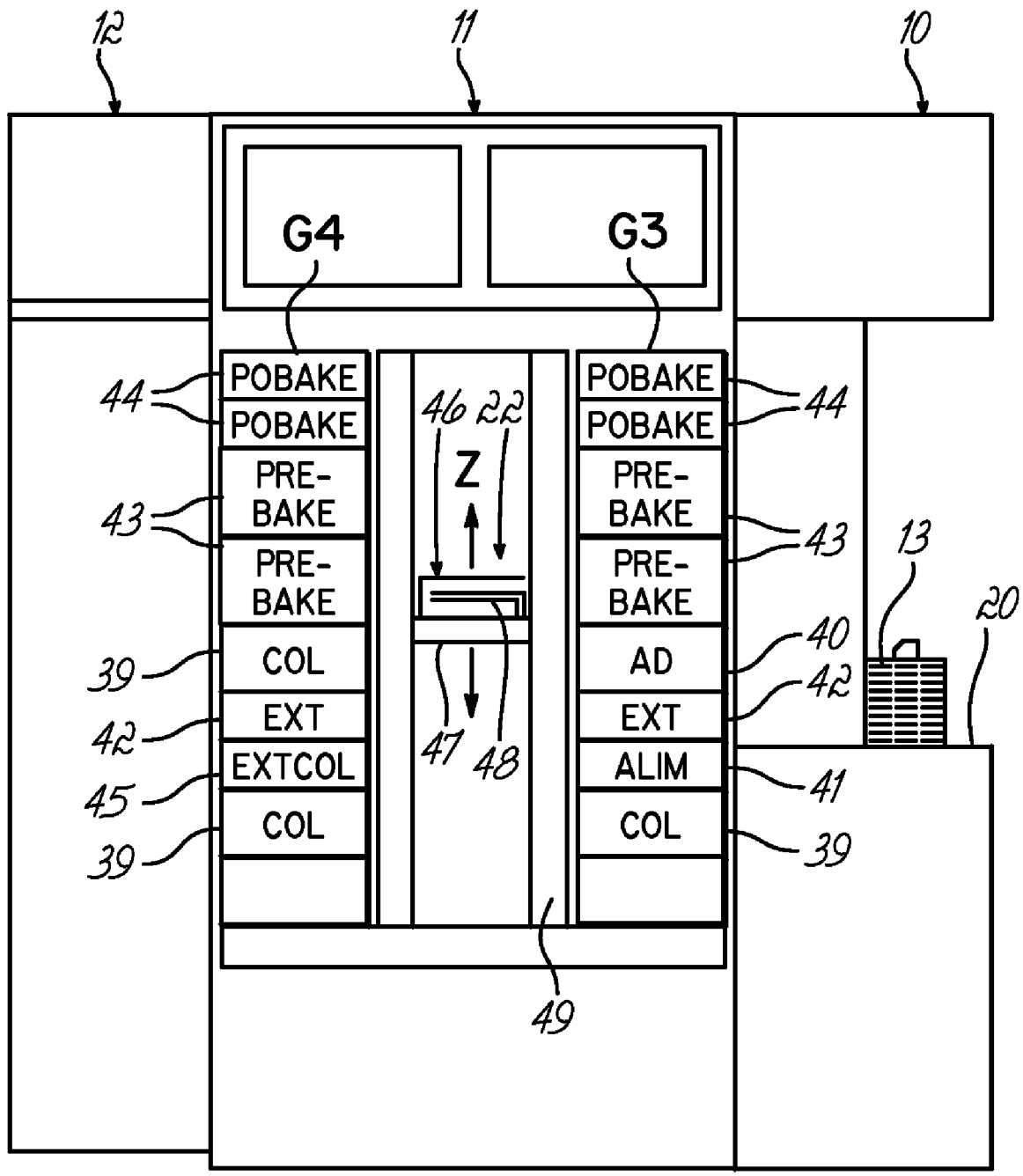
FIG. 3 is a partially cut-away back view showing schematically the details of the process unit groups in the center of the coating/developing process system of FIG. 1, as taken along line 3-3.

With reference to FIGS. 1-3, a coating/developing process system 1 comprises a cassette station 10, a process station 11, and an interface section 12, which are contiguously formed as one unit. In the cassette station 10, a cassette (CR) 13 storing a plurality of substrates represented by wafers (W) 14 (e.g., 25 wafers) is loaded into, and unloaded from, the system 1. The process station 11 includes various single-wafer processing units for applying a predetermined treatment required for a coating/developing step to individual wafers (W) 14. These process units are arranged in predetermined positions of multiple stages, for example, within first (G1), second (G2), third (G3), fourth (G4) and fifth (G5) multiple-stage process unit groups 31, 32, 33, 34, 35. The interface section 12 delivers the wafers (W) 14 between the process station 11 and an exposure unit (not shown) that can be abutted against the process station 11.

A cassette table 20 of cassette station 10 has positioning-projections 20a on which a plurality of wafer cassettes (CR) 13 (for example, at most 4) are mounted. The wafer cassettes (CR) 13 are thereby aligned in line in the direction of an X-axis (the up-and-down direction of FIG. 1) with a wafer inlet/outlet 9 facing the process station 11. The cassette station 10 includes a wafer transfer carrier 21 movable in the aligning direction (X-axis) of cassettes 13 and in the aligning direction (Z-axis, vertical direction) of wafers 14 stored in the wafer cassette (CR) 13. The wafer transfer carrier 21 gains access selectively to each of the wafer cassettes (CR) 13.

The wafer transfer carrier 21 is further designed rotatable in a Θ (theta) direction, so that it can gain access to an alignment unit (ALIM) 41 and an extension unit (EXT) 42 belonging to a third multiple-stage process unit group (G3) 33 in the process station 11, as described later.

The process station 11 includes a main wafer transfer mechanism 22 (movable up-and-down in the vertical direction) having a wafer transfer machine 46. All process units are arranged around the main transfer mechanism 22, as shown in FIG. 1. The process units may be arranged in the form of multiple stages G1, G2, G3, G4 and G5.

The main wafer transfer mechanism 22 has a wafer transfer machine 46 that is movable up and down in the vertical direction (Z-direction) within a hollow cylindrical supporter 49, as shown in FIG. 3. The hollow cylindrical supporter 49 is connected to a rotational shaft of a motor (not shown). The cylindrical supporter 49 can be rotated about the shaft synchronously with the wafer transfer machine 46 by the driving force of the motor rotation. Thus, the wafer transfer machine 46 is rotatable in the Θ direction. Note that the hollow cylindrical supporter 49 may be connected to another rotational axis (not shown), which is rotated by a motor.

The wafer transfer machine 46 has a plurality of holding members 48 which are movable back and forth on a table carrier 47. The wafer (W) 14 is delivered between the process units by the holding members 48.

In the process unit station 11 of this embodiment, five process unit groups G1, G2, G3, G4, and G5 can be sufficiently arranged. For example, first (G1) and second (G2) multiple-stage process unit groups 31, 32 are arranged in the front portion 2 (in the forehead in FIG. 1) of the system 1. A third multiple-stage process unit group (G3) 33 is abutted against the cassette station 10. A fourth multiple-stage process unit group (G4) is abutted against the interface section 12. A fifth multiple-stage process unit group (G5) can be optionally arranged in a back portion 3 of system 1.

As shown in FIG. 2, in the first process unit group (G1) 31, two spinner-type process units, for example, a resist coating unit (COT) 36 and a developing unit (DEV) 37, are stacked in the order mentioned from the bottom. The spinner-type process unit used herein refers to a process unit in which a predetermined treatment is applied to the wafer (W) 14 mounted on a spin chuck 52 (see FIG. 4) placed in a cup (CP) 38. Also, in the second process unit group (G2) 32, two spinner process units such as a resist coating unit (COT) 36 and a developing unit (DEV) 37, are stacked in the order mentioned from the bottom. It is preferable that the resist coating unit (COT) 36 be positioned in a lower stage from a structural point of view and to reduce maintenance time associated with the resist-solution discharge. However, if necessary, the coating unit (COT) 36 may be positioned in the upper stage.

As shown in FIG. 3, in the third process unit group (G3) 33, open-type process units, for example, a cooling unit (COL) 39 for applying a cooling treatment, an alignment unit (ALIM) 41 for performing alignment, an extension unit (EXT) 42, an adhesion unit (AD) 40 for applying an adhesion treatment to increase the deposition properties of the resist, two pre-baking units (PREBAKE) 43 for heating a wafer 14 before light-exposure, and two post-baking units (POBAKE) 44 for heating a wafer 14 after light exposure, are stacked in eight stages in the order mentioned from the bottom. The open type process unit used herein refers to a process unit in which a predetermined treatment is applied to a wafer 14 mounted on a support platform within one of the processing units. Similarly, in the fourth process unit group (G4) 34, open type process units, for example, a cooling unit (COL) 39, an extension/cooling unit (EXTCOL) 45, an extension unit (EXT) 42, another cooling unit (COL), two pre-baking units (PREBAKE) 43 and two post-baking units (POBAKE) 44 are stacked in eight stages in the order mentioned from the bottom.

Since the process units for low-temperature treatments, such as the cooling unit (COL) 39 and the extension/cooling unit (EXTCOL) 45, are arranged in the lower stages and the process units for higher-temperature treatments, such as the pre-baking units (PREBAKE) 43 and the post-baking units (POBAKE) 44 and the adhesion unit (AD) 40 are arranged in the upper stages in the aforementioned unit groups, thermal interference between units can be reduced. Alternatively, these process units may be arranged differently.

The interface section 12 has the same size as that of the process station 11 in the X direction but shorter in the width direction. A movable pickup cassette (PCR) 15 and an unmovable buffer cassette (BR) 16 are stacked in two stages in the front portion of the interface section 12, an optical edge bead remover 23 is arranged in the back portion, and a wafer carrier 24 is arranged in the center portion. The wafer transfer carrier 24 moves in the X- and Z-directions to gain access to both cassettes (PCR) 15 and (BR) 16 and the optical edge bead remover 23. The wafer carrier 24 is also designed rotatable in the Θ direction, so that it can gain access to the extension unit (EXT) 42 located in the fourth multiple-stage process unit group (G4) 34 in the process station 11 and to a wafer deliver stage (not shown) abutted against the exposure unit (not shown).

In the coating/developing process system 1, the fifth multiple-stage process unit group (G5, indicated by a broken line) 35 is designed to be optionally arranged in the back portion 3 at the backside of the main wafer mechanism 22, as described above. The fifth multiple-stage process unit group (G5) 35 is designed to be shifted sideward along a guide rail 25 as viewed from the main wafer transfer mechanism 22. Hence, when the fifth multiple-stage process unit group (G5) 35 is positioned as shown in FIG. 1, a sufficient space is obtained by sliding the fifth process unit group (G5) 35 along the guide rail 25. As a result, a maintenance operation to the main wafer transfer mechanism 22 can be easily carried out from the back side. To maintain the space for maintenance operation to the main wafer transfer mechanism 22, the fifth process unit group (G5) 35 may be not only slid linearly along the guide rail 25 but also shifted rotatably outward in the system.

Figure 4:
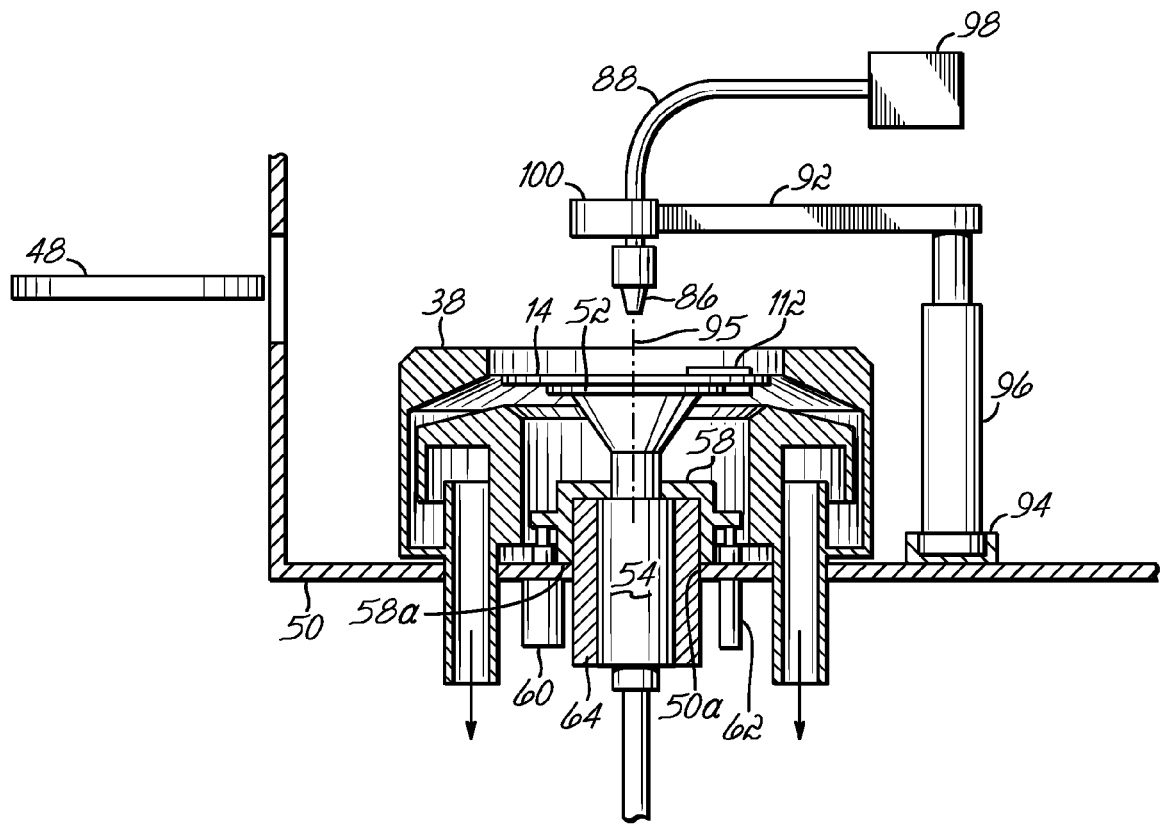
FIG. 4 is a cross-sectional view of a resist coating unit (COT) in the coating/developing process system of FIG. 1.

With reference to FIG. 4, the resist coating unit (COT) 36 includes a coater bowl or cup (CP) 38 and a substrate support represented by a spin chuck 52 disposed within the coater cup (CP) 38. One of the semiconductor wafers (W) 14 is placed on the spin chuck 52 and secured by suction to hold the wafer (W) 14 in place as the chuck 52 is rotated about an azimuthal axis 95 relative to the stationary coated cup (CP) 38. The diameter of the spin chuck 52 is less than the diameter of wafer (W) 14 so that the wafer 14 projects radially beyond the peripheral edge of spin chuck 52.

The spin chuck 52 is operatively coupled by an axle with by a driving motor 54, such as an electric motor, that is liftably arranged at an opening 50*a* provided in a unit bottom plate 50. The drive motor 54 rotates the spin chuck 52. The driving motor 54 is further connected to a vertical drive mechanism 60 including an air cylinder and to a vertical guide unit 62 via a cap-form flange member 58. A cylindrical cooling jacket 64 made of, for example, stainless steel, is provided at the side surface of the driving motor 54. The flange member 58 covers the upper half portion of the cooling jacket 64. The spin chuck 52 is configured to hold and rotate the wafer 14 relative to the stationary coater cup 38 about the azimuthal axis 95.

When the liquid resist is applied, a lower end 58*a* of the flange member 58 comes in tight contact with the unit bottom plate 50 at the outer circumference portion of the opening 50*a*. In this manner, the unit is sealed airtight. When the semiconductor wafer (W) 14 is delivered between the spin chuck 52 and the holding member 48 of the main wafer transfer mechanism 22, the vertical drive machine 60 lifts the driving motor 54 together with the spin chuck 52 upwards, thereby separating the lower end of the flange member 58 upward from the unit bottom plate 50. The coater cup (CP) 38 catches excess liquid resist and particles ejected from the rotating semiconductor wafer (W) 14 during application of the resist as the spin chuck 52 rotates the wafer 14.

A nozzle 86 for supplying liquid resist solution to the top surface of the semiconductor wafer (W) 14 is connected to a supply 98 by a tube 88. The nozzle 86 is detachably disposed at a top end portion of an arm 92 via a nozzle supporter 100. The scan arm 92 is located at the top of a vertical supporting member 96 that is horizontally movable along the guide rail 94 provided in one direction (the Y-axis) on the unit bottom 50. The scan arm 92 therefore moves in the Y-axis direction together with the vertical supporting member 96 by a Y-axis driving mechanism (not shown). The scan arm 92 can be moved along the guide rail 94 or moved vertically so that that the scan arm 93 does not obstruct the ability of one of the holding members 48 of the wafer transfer machine 46 to access the spin chuck 52 for wafer exchanges.

Figure 5:
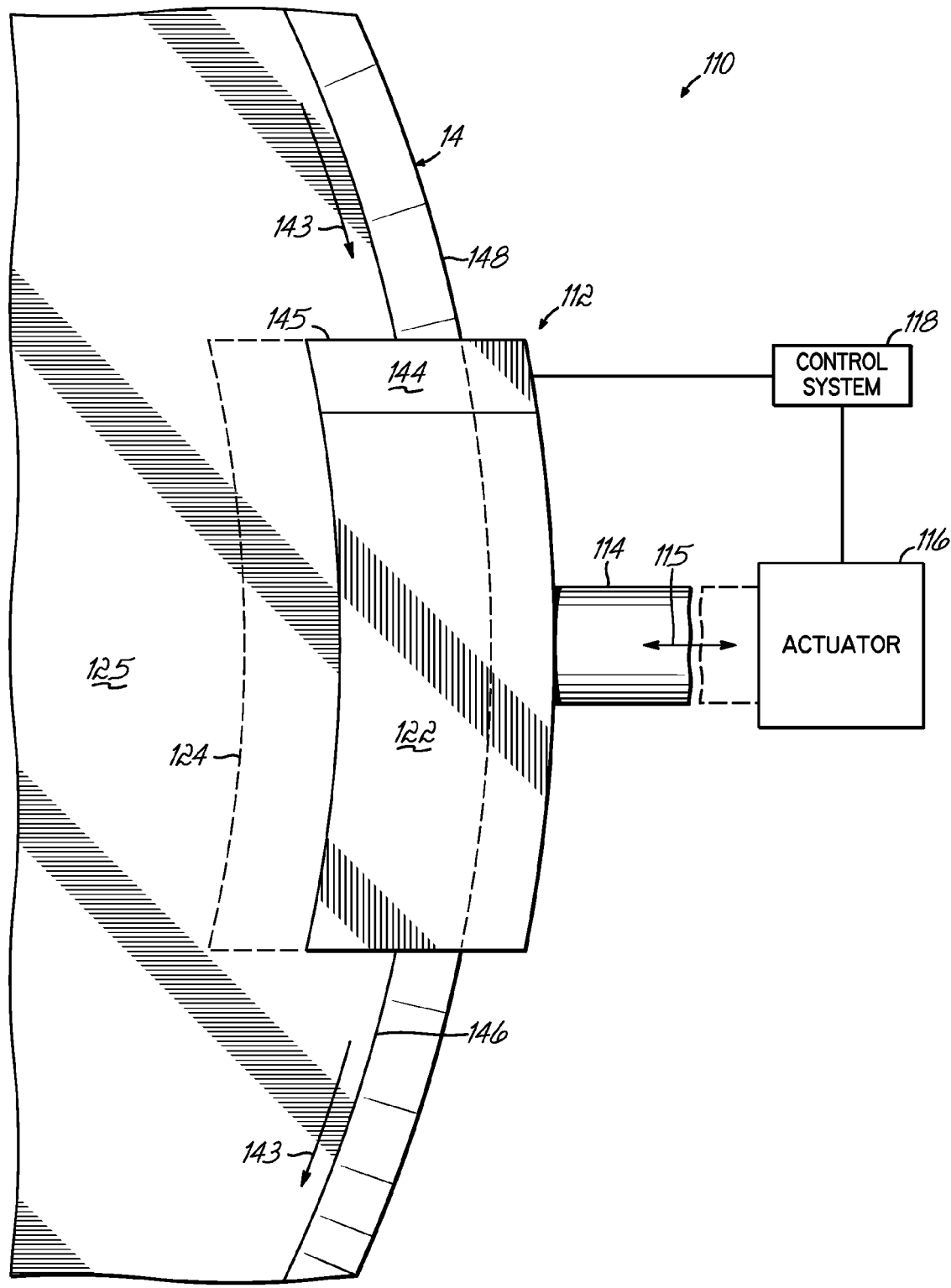
FIG. 5 is a top view of a portion of the resist coating unit (COT) of FIG. 4 showing an edge bead removal device of the invention.

Resist solution in the liquid phase is dispensed from the nozzle 86 onto a top surface 130 (FIG. 6) of the wafer 14, which is being rotated on the spin chuck 52. Typically, the nozzle 86 is positioned to dispense an amount of liquid resist solution at, or near, the center of the wafer 14. The spin chuck 52 rotates the wafer 14 at a high rotational velocity to spread the liquid resist solution radially outward from the center of the wafer 14 by centrifugal force towards a peripheral rim 148 of the wafer 14 to coat a top surface 130 of the wafer 14 with a layer 125 of the liquid resist solution, as best shown in FIG. 5. Near the peripheral rim 148, excess liquid resist solution may accumulate to define an edge bead, which is not visible in FIG. 4.

Figure 6:
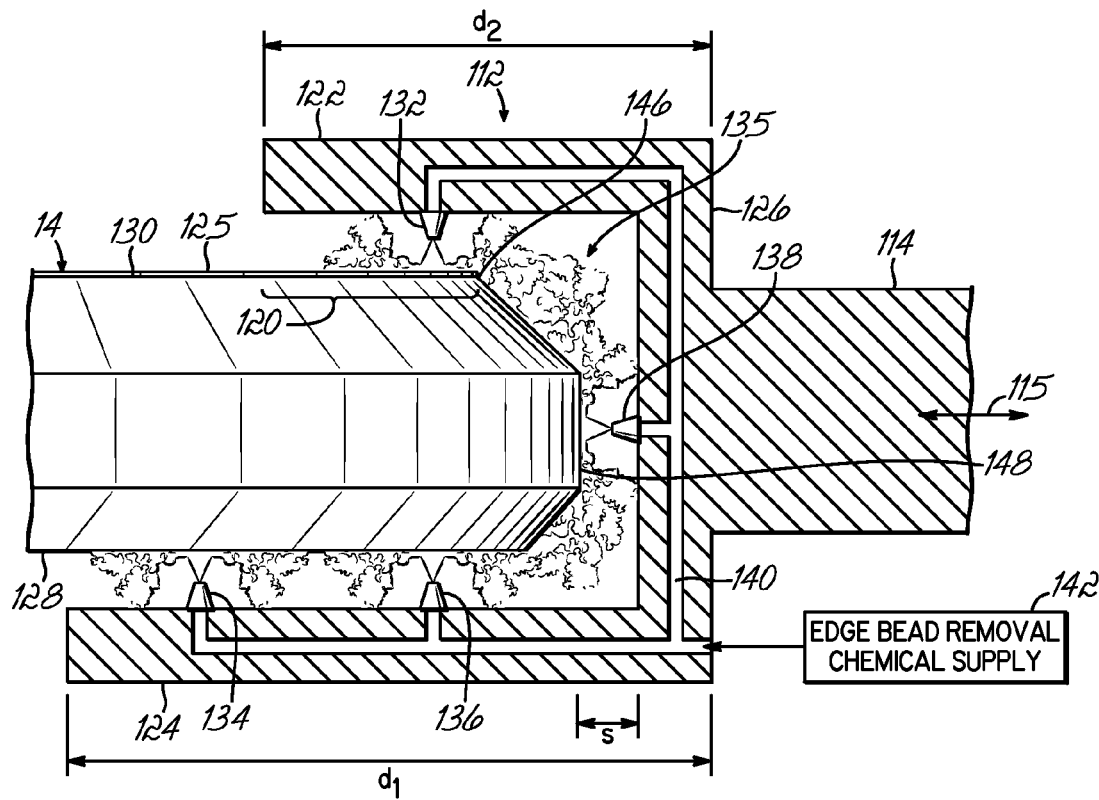
FIG. 6 is a side view of the portion of the resist coating unit (COT) of FIG. 5.

With reference to FIGS. 4-6, the resist coating unit (COT) 36 further includes an edge bead removal (EBR) device 110 that includes a head 112, an arm 114 carrying the head 112 at one end, an actuator 116 operatively coupled with an opposite end of the arm 114, and a controller 118. The controller 118 generally operates to coordinate the operation of each of the components that collectively form EBR device 110. Controller 118 may be a programmable microprocessor configured to interface with the various components of the EBR device 110. Software resident in a processor, such as a microprocessor, of the controller 118 sends electrical signals as movement instructions to the actuator 116 and receives electrical signals from the head 112 as feedback information about the location of the head 112, as described below. The processor of the controller 118 receives instructions from a memory or like device, and executes those instructions, thereby performing a process defined by those instructions.

The controller 118 is coupled electrically with the actuator 116 by a communication link that may be constituted by a cable or wire. Under the command of instructions supplied from the controller 118, the actuator 116 extends and retracts the arm 114 relative to the azimuthal axis 95 of spin chuck 52, as indicated diagrammatically by the double headed arrow 115, to position the head 112 relative to the peripheral rim 148 of the semiconductor wafer (W) 14. The head 112 accesses the interior of the centered coater cup (CP) 38 and the spin chuck 52 through an opening in the centered coater cup (CP) 38 at the level of the semiconductor wafer (W) 14 held by the spin chuck 52. The head 112 has a stored, or "home", position relative to the coater cup (CP) 38 so that the head 112 does not obstruct the ability of one of the holding members 48 of the wafer transfer machine 46 to access the spin chuck 52 for wafer exchanges. In the stored position, the head 112 is retracted from the peripheral rim 148 of the wafer (W) 14. The head 112 also has an extended position in which the head 112 is positioned proximate to the peripheral rim 148 of the wafer (W) 14.

The head 112 of the EBR device 110 includes a curved upper frame 122, a curved lower frame 124, and a curved vertical post 126 that is physically coupled with the arm 114. The vertical post 126 connects the upper and lower frames 122, 124 and separates the upper and lower frames 122, 124 by a height that is slightly greater than the thickness of the semiconductor wafer (W) 14. The lower frame 124, which is proximate to a backside 128 of the semiconductor wafer (W) 14, has a larger radial dimension, $d_1$, than the radial dimension, $d_2$, of the upper frame 122, which is proximate to the top surface 130 of the semiconductor wafer (W) 14.

The head 112 of the EBR device 110 further includes a nozzle 132 coupled with the upper frame 122, a pair of nozzles 134, 136 coupled with the lower frame 124, and a nozzle 138 coupled with the vertical post 126. The head 112 incorporates a network of internal fluid passageways 140 that couple the nozzles 132, 134, 136, 138 with a supply 142 of an edge bead removal chemical 135. The invention contemplates that the head 112 may include a different number of nozzles coupled by the internal fluid passageways 140 with the supply 142. The supply 142 may include one or more precision flow valves for metering the flow of the edge bead removal chemical 135 to the nozzles 132, 134, 136, 138. The operation of the precision flow valve(s) of supply 142 may be coordinated with the angular velocity of the spin chuck 52 to optimize edge bead removal.

Each of the nozzles 132, 134, 136, 138 receives a flow of the edge bead removal chemical 135 from the supply 142 through the internal fluid passageways 140 and dispenses a stream of the edge bead removal chemical 135 toward the semiconductor wafer (W) 14. Specifically, nozzle 132 dispenses a stream of the edge bead removal chemical 135 toward an annular region 120 of a resist layer 125 overlying an annular region on the top surface 130. Nozzles 134, 136 each dispense a stream of the edge bead removal chemical 135 toward the backside 128. Nozzle 138 dispenses a stream of the edge bead removal chemical 135 toward the peripheral rim 148 of the semiconductor wafer (W) 14. The peripheral rim 148 of the semiconductor wafer (W) 14 is connected to the top surface 130 by an intervening beveled surface that intersects the top surface 130 at a corner 146 and another intervening beveled surface that intersects the backside 128. As the wafer (W) 14 rotates, the edge bead removal chemical 135 wets the backside 128 near the lower frame 122, the annular region 120 of resist layer 125 on the top surface 130, and the peripheral rim 148, including the beveled surfaces. The proximity of the head 112 to the peripheral rim 148 ensures uniform wetting.

An optical detector 144 is located near a leading edge 145 of the head 112. When the head 112 is in the extended position, the optical detector 144 senses a radial location of the peripheral rim 148 of the wafer (W) 14 relative to the head 112 and the azimuthal axis 95. The semiconductor wafer (W) 14 is rotated or spun, as indicated by single headed arrows 143 (FIG. 5), about the azimuthal axis 95 (FIG. 4) such that the optical detector 144 is upstream from the nozzles 132, 134, 136, 138 in the direction of rotation. The optical detector 144 includes an optical array of, for example, light emitting diodes and light detectors operative to detect the location of, for example, the peripheral rim 148 of the semiconductor wafer (W) 14 at the outer radius of the annular region 120. The optical detector 144 is electrically coupled with the controller 118 by a communication link that may be constituted by a cable or wire. The optical detector 144 communicates electrical signals to the controller 118 over the communication link that indicates the location of the corner 146 as the semiconductor wafer (W) 14 is rotated through different arc lengths of a complete $2\pi c$ radian rotation.

The optical detector 144 is used to spatially map the location of the peripheral rim 148 relative to the head 112 about the entire circumference of the semiconductor wafer (W) 14 before the edge bead removal chemical 135 is dispensed from the nozzles 132, 134, 136, 138. To that end, the controller 118 causes the spin chuck 52 to rotate semiconductor wafer (W) 14 at a relatively low angular velocity (e.g., 10 revolutions per minute to 100 revolutions per minute) through a complete $2\pi$ radian rotation. As the wafer (W) 14 is rotated through the complete rotation, the radial location of the peripheral rim 148 relative to the head 112 and the azimuthal axis 95 is mapped by the optical detector 144. The optical detector 144 communicates an electrical signal to the controller 118 representing the radial location at various different angular orientations of the wafer (W) 14. The controller 118 stores the map for future use in tracking the peripheral rim 148 of the semiconductor wafer (W) 14 during an actual edge bead removal process.

The controller 118 relies on the spatial mapping of the peripheral rim 148 for controlling the radial location of the head 112 relative to the peripheral rim 148 so that the vertical post 126 has a constant radial gap or spacing, s, from the peripheral rim 148 when the spin chuck 52 is rotating the wafer (W) 14 at a relatively high angular velocity and edge bead removal chemical 135 is dispensed from the nozzles 132, 134, 136, 138. The controller 118 operates the actuator 116 to adjust the position of the arm 114 to extend and withdraw the head 112 to maintain the constant spacing, s, to compensate for mapped variations in the spatial location of the peripheral rim 148 relative to the head 112. Spatial variations in the location of peripheral rim 148 may arise from, for example, placement errors on the spin chuck 52 or sizing errors in the diameter of wafer (W) 14. Optionally, the location of the corner 146 may be actively monitored by the controller 118 using electrical signals communicated from the optical detector 144 for control feedback during the edge bead removal process when the spin chuck 52 is rotating the semiconductor wafer (W) 14 at a relatively high angular velocity.

The edge bead removal chemical 135 dispensed from the nozzle 132, 134, 136, 138 removes any extraneous resist (not shown) from the backside 128 and the peripheral rim 148, and the annular region 120 of the resist layer 125 on the top surface 130 of wafer (W) 14. Controlling the position of the head 112, as the wafer (W) 14 rotates, according to the spatial map of the peripheral rim 148 so that the vertical post 126 has a constant spacing, s, from the peripheral rim 148 ensures that the radial width of the annular region 120 of resist layer 125 removed from the top surface 130 of the semiconductor wafer (W) 14 is uniformly wide. As a result, the edge bead removal chemical 135 dispensed from the nozzles 132, 134, 136, 138 wets a highly controlled ring-shaped or annular strip of the resist layer 125 constituting the removed annular region 120. The radial dimension of the upper frame 122 will at least partially determine the radial dimension of the annular region 120 removed from resist layer 125 to reveal the underlying top surface 130 of wafer (W) 14.

It is believed that the annular region 120 of the resist layer 125 may be removed using the EBR device 110 with 5 to 10 wafer revolutions at an angular velocity of 10 revolutions per minute to 100 revolutions per minute. As the wafer (W) 14 is rotated by the spin chuck 52, the chemical is largely confined within the head 112 in proximity to the peripheral edge 148 so that an angular arc of the annular region 120 is exposed to the edge bead removal chemical 135. The angular arc changes as the wafer (W) 14 rotates. Each angular arc is exposed to the edge bead removal chemical 135 upon each complete rotation of wafer (W) 14. Edge bead removal chemical 135 and dissolved resist ejected from the wetted angular arcs of the annular region 120 are caught by the coater cup (CP) 38.

The accuracy of the spatial position of the head 112 and the confinement of the edge bead removal chemical 135 within the head 112 contribute to removing an annular region 120 of the resist layer 125, including the edge bead (not shown), that is significantly narrower than the corresponding annular region removed by conventional methods. The removed annular region 120 of the resist layer 125 has a radial dimension or annular width that is measured radially inward from the peripheral rim 148. For example, the EBR device 110 may be operated to remove only a 0.1 mm wide annular region 120 of the resist layer 125 proximate to the peripheral rim 148 of wafer (W) 14. Reducing the annular width of the removed annular region 120 of resist layer 125, in comparison with conventional edge bead removal techniques, maximizes the area available on the top surface 130 of the wafer (W) 14 for fabricating devices. The final number, or yield, of functional integrated circuits on the wafer (W) 14 at the end of the IC fabrication process is of utmost importance to semiconductor manufacturers, and increasing the yield of circuits on the wafer (W) 14 is a primary main goal of semiconductor fabrication.

In comparison with conventional edge bead removal methods, the EBR device 110 consumes less edge bead removal chemical 135 for removing the annular region 120 of resist layer 125, which reduces cost and waste for disposal. In comparison with conventional edge bead removal methods, the EBR device 110 may remove the annular region 120 of resist layer 125 more efficiently, which increases process throughput by reducing the time required to remove the annular region 120 of resist layer 125. The close proximity of the head 112 to the wafer (W) 14 reduces the wetted area on the wafer (W) 14, in comparison with conventional edge bead removal methods.

The composition of the edge bead removal chemical 135 may include a surfactant to enhance wicking about the peripheral rim 148 of the wafer (W) 14. Reducing the viscosity of the edge bead removal chemical 135 is believed to enhance the wicking and may be used in combination with the head 112 to optimize the edge bead removal process. The change of surface tension of the edge bead removal chemical 135 caused by the addition of surfactant further improves the wicking.

While the invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicant's general inventive concept. The scope of the invention itself should only be defined by the appended claims.

What is claimed is:

1. An apparatus for spin coating a material in a liquid phase across a top surface of a substrate to form a layer of the material and exposing an annular region of the layer proximate to a peripheral rim of the substrate to a chemical capable of dissolving the material, the apparatus comprising:
   a coater cup;
   a substrate support in said coater cup, said substrate support configured to hold and rotate the substrate relative to said coater cup about an azimuthal axis;
   a nozzle adapted to dispense the material in the liquid phase onto the top surface of the substrate held by said substrate support;
   a head radially moveable relative to said azimuthal axis of said substrate support between a first position in which said head is proximate to the peripheral rim of the substrate and a second position in which said head is retracted from the peripheral rim of the substrate, said head including a plurality of nozzles adapted to dispense the chemical to contact the layer in the annular region when the head is in the first position;
   a controller;
   an actuator physically coupled with said head and electrically coupled with said controller, said actuator operative to move said head between said first and second positions as instructed by said controller; and
   a detector adapted to sense a radial location of the peripheral rim of the substrate relative to said head when said head is in said first position and being rotated by said substrate support, said detector configured to communicate an electrical signal to said controller representing said radial location,
   wherein said controller is configured to operate said actuator to move said head relative to said peripheral rim, when said nozzle is dispensing the chemical, in response to said electrical signal to compensate for changes in the radial location of the peripheral rim of the substrate relative to said head.

2. The apparatus of claim 1 wherein said detector is disposed in said head.

3. The apparatus of claim 1 wherein said head comprises a first frame proximate to a top surface of the substrate in said first position, a second frame proximate to a backside of the substrate in said first position, and a post joining said first and second frames, said post, said first frame, and said second frames each carrying at least one of said nozzles.

4. The apparatus of claim 1 wherein said head includes fluid passageways fluidly coupling said nozzles with a supply of the chemical.

5. The apparatus of claim 1 wherein said detector is an optical detector.

* * * * *

UNITED STATES PATENT AND TRADEMARK OFFICE
CERTIFICATE OF CORRECTION

| | | |
|---|---|---|
| PATENT NO. | : 7,673,582 B2 | Page 1 of 1 |
| APPLICATION NO. | : 11/537619 | |
| DATED | : March 9, 2010 | |
| INVENTOR(S) | : Thomas E. Winter | |

It is certified that error appears in the above-identified patent and that said Letters Patent is hereby corrected as shown below:

In column 2, line 27, change "add" to --adds--.

In column 5, line 48, after "with", delete "by".

In column 6, line 16, after "that", delete "that".

In column 8, line 45, change "nozzle" to --nozzles--.

In column 10, line 51, Claim 3, change "frames" to --frame--.

Signed and Sealed this

Sixth Day of July, 2010

David J. Kappos
*Director of the United States Patent and Trademark Office*